(12) United States Patent
Xiao et al.

(10) Patent No.: US 10,013,378 B2
(45) Date of Patent: Jul. 3, 2018

(54) ASIC CHIP SYSTEM DEDICATED FOR OPTICAL THREE-DIMENSIONAL SENSING

(71) Applicant: SHENZHEN ORBBEC CO., LTD., Shenzhen, Guangdong (CN)

(72) Inventors: Zhenzhong Xiao, Guangdong (CN); Honghuai Xu, Guangdong (CN); Long Liu, Guangdong (CN); Yuanhao Huang, Guangdong (CN)

(73) Assignee: SHENZHEN ORBBEC CO., LTD., Shenzhen (CN)

( * ) Notice: Subject to any disclaimer, the term of this patent is extended or adjusted under 35 U.S.C. 154(b) by 56 days.

(21) Appl. No.: 15/321,928

(22) PCT Filed: May 21, 2015

(86) PCT No.: PCT/CN2015/079451
§ 371 (c)(1),
(2) Date: Dec. 23, 2016

(87) PCT Pub. No.: WO2015/196879
PCT Pub. Date: Dec. 30, 2015

(65) Prior Publication Data
US 2017/0124014 A1    May 4, 2017

(30) Foreign Application Priority Data
Jun. 26, 2014    (CN) .......................... 2014 1 0294727

(51) Int. Cl.
*G06F 13/42*        (2006.01)
*G06F 13/00*        (2006.01)
(Continued)

(52) U.S. Cl.
CPC ........ *G06F 13/4027* (2013.01); *G06F 1/3253* (2013.01); *G06F 13/36* (2013.01);
(Continued)

(58) Field of Classification Search
None
See application file for complete search history.

(56) References Cited

U.S. PATENT DOCUMENTS 8,908,016 B2 * 12/2014 Gordon ................ G01B 11/002
348/49
2007/0206204 A1 * 9/2007 Jia ...................... G01B 11/2527
356/604

FOREIGN PATENT DOCUMENTS

CN        201118765 A        9/2008
CN        102980527 A        3/2013
(Continued)

OTHER PUBLICATIONS

International Search Report and Written Opinion for Application No. PCT/CN2015/079451, dated Aug. 12, 2015, 8 pages.

*Primary Examiner* — Michael Sun

(57) ABSTRACT

The present disclosure relates to a dedicated ASIC chip system for optical three-dimensional sensing, including a DEPTH ENGINE module, a REGISTER PROCESSOR module, a controller module, a register module, an RGB CMOS driving module, an IR CMOS driving module, an AXI bus interface module, an APB bus interface module, an AXI/APB bridge module, a Flash storage driving module and a DDR3 storage driving module; and when non-optical three-dimensional data is processed, the control module sends an instruction to connect an external Flash memory for processing the non-optical three-dimensional data. When optical three-dimensional data is processed, the control module sends an instruction to simultaneously connect the external Flash memory and an external DDR3 memory for processing the optical three-dimensional data, so as to quickly process high-precision optical three-dimensional (Continued)

data, the resolution of an optical three-dimensional depth image obtained from the processing is high, and the delay is short.

17 Claims, 2 Drawing Sheets

(51) Int. Cl.
- *G06F 13/40* (2006.01)
- *G06F 13/36* (2006.01)
- *G06F 13/38* (2006.01)
- *G11C 16/24* (2006.01)
- *G11C 16/26* (2006.01)
- *G06F 1/32* (2006.01)

(52) U.S. Cl.
CPC ........ *G06F 13/382* (2013.01); *G06F 13/4022* (2013.01); *G06F 13/4072* (2013.01); *G11C 16/24* (2013.01); *G11C 16/26* (2013.01)

(56) References Cited

FOREIGN PATENT DOCUMENTS

| | | |
|---|---|---|
| CN | 104462013 A | 3/2015 |
| WO | 2012/126103 A1 | 9/2012 |

\* cited by examiner

US 10,013,378 B2

ASIC CHIP SYSTEM DEDICATED FOR OPTICAL THREE-DIMENSIONAL SENSING

CROSS-REFERENCE TO RELATED APPLICATIONS

This application is a National Phase application of International Application No. PCT/CN2015/079451, filed on May 12, 2015, which is based on and claims priority to and benefits of Chinese Patent Application No. 201410294727.5, filed with State Intellectual Property Office on Jun. 26, 2014. The entire contents of the above-referenced applications are incorporated herein by reference.

TECHNICAL FIELD

The present disclosure relates to the technical field of optical three-dimensional sensing, and specifically relates to a dedicated ASIC (Application-Specific Integrated Circuit) chip system for optical three-dimensional sensing.

BACKGROUND

A general ASIC chip system for an optical three-dimensional sensor is only connected with one external FLASH memory in general. The use of the FLASH memory results in a low image processing resolution of the traditional ASIC chip system for the optical three-dimensional sensor and a small number of image frames processed per minute, and thus only the demands of processing of low-precision optical data can be satisfied. Once high-precision optical three-dimensional data needs to be processed, the data transmission speed between the traditional ASIC chip system for the optical three-dimensional sensor and the FLASH memory is low, directly resulting in a low resolution of an optical three-dimensional depth image obtained from the processing and a long delay.

SUMMARY

An object of the present disclosure is to provide a dedicated ASIC chip system for optical three-dimensional sensing, which can quickly process high-precision optical three-dimensional data, the resolution of an optical three-dimensional depth image obtained from the processing is high, and the delay is short.

To achieve the object above, the present disclosure uses a technical solution: a dedicated ASIC chip system for optical three-dimensional sensing includes a DEPTH ENGINE module, a REGISTER PROCESSOR module, a controller module, a register module, an RGB (red, green, blue) CMOS (Complementary Metal-Oxide Semiconductor) driving module, an IR (infrared) CMOS driving module, an AXI (Advanced eXtensible Interface) bus interface module, an APB (Advanced Peripheral Bus) bus interface module, an AXI/APB bridge module and an external storage driving module;

a signal input terminal of the DEPTH ENGINE module is connected with the IR CMOS driving module, a control signal terminal of the DEPTH ENGINE module is connected with the controller module, a data terminal of the DEPTH ENGINE module is connected with the AXI bus interface module, a signal input terminal of the REGISTER PROCESSOR module is connected with the RGB CMOS driving module, a control signal terminal of the REGISTER PROCESSOR module is connected with the controller module, the controller module is further connected with the register module and the AXI bus interface module respectively, the register module is further connected with the AXI bus interface module, the AXI bus interface module is connected with the APB bus interface module through the AXI/APB bridge module, the RGB CMOS driving module is further connected with the AXI bus interface module and the APB bus interface module respectively, the IR CMOS driving module is further connected with the AXI bus interface module and the APB bus interface module respectively, and the external storage driving module is connected with the AXI bus interface module and the APB bus interface module respectively;

the external storage driving module includes a Flash storage driving module connected with an external Flash memory and a DDR3 (double data rate type three) storage driving module connected with an external DDR3 memory; when optical three-dimensional data is processed, the control module sends a first instruction to simultaneously connect the external Flash memory with the Flash storage driving module and connect the external DDR3 memory with the DDR3 storage driving module for processing the optical three-dimensional data; when non-optical three-dimensional data is processed, the control module sends a second instruction to connect the external Flash memory with the Flash storage driving module for processing the non-optical three-dimensional data and disconnect the external DDR3 memory with the DDR3 storage driving module;

the dedicated ASIC chip system for optical three-dimensional sensing further includes a switch module, the switch module is connected with the controller module, when the switch module is closed by a switching device or is closed by a third instruction sent by the controller module, the external DDR3 memory is connected with the DDR3 storage driving module, and when the switch module is disconnected by the switching device or is disconnected by a fourth instruction sent by the controller module, the external DDR3 memory is disconnected with the DDR3 storage driving module; and the dedicated ASIC chip system for optical three-dimensional sensing further includes an I2S interface module, a signal input terminal of the I2S (Inter-IC Sound) interface module is connected with an external audio sensor, and a signal output terminal of the I2S interface module is connected with the AXI bus interface module and the APB bus interface module respectively.

The dedicated ASIC chip system for optical three-dimensional sensing further includes a USB interface module, a data input terminal of the USB interface module is connected with the AXI bus interface module, and a data output terminal of the USB interface module is connected with an external image processor.

The USB interface module includes a USB3.0 controller module and a USB interface, and the USB3.0 controller module is connected with the USB interface.

The dedicated ASIC chip system for optical three-dimensional sensing further includes a power management module, and the power management module is connected with the APB bus interface module.

The RGB CMOS driving module includes an RGB CMOS interface, the IR CMOS driving module includes an IR CMOS interface, the Flash storage driving module includes a Flash interface, and the DDR3 storage driving module includes a DDR3 interface.

To achieve the object above, the present disclosure uses another technical solution:

a dedicated ASIC chip system for optical three-dimensional sensing includes a DEPTH ENGINE module, a REG- ISTER PROCESSOR module, a controller module, a register module, an RGB CMOS driving module, an IR CMOS driving module, an AXI bus interface module, an APB bus interface module, an AXI/APB bridge module and an external storage driving module;

a signal input terminal of the DEPTH ENGINE module is connected with the IR CMOS driving module, a control signal terminal of the DEPTH ENGINE module is connected with the controller module, a data terminal of the DEPTH ENGINE module is connected with the AXI bus interface module, a signal input terminal of the REGISTER PROCESSOR module is connected with the RGB CMOS driving module, a control signal terminal of the REGISTER PROCESSOR module is connected with the controller module, the controller module is further connected with the register module and the AXI bus interface module respectively, the register module is further connected with the AXI bus interface module, the AXI bus interface module is connected with the APB bus interface module through the AXI/APB bridge module, the RGB CMOS driving module is further connected with the AXI bus interface module and the APB bus interface module respectively, the IR CMOS driving module is further connected with the AXI bus interface module and the APB bus interface module respectively, and the external storage driving module is connected with the AXI bus interface module and the APB bus interface module respectively;

the external storage driving module includes a Flash storage driving module connected with an external Flash memory and a DDR3 storage driving module connected with an external DDR3 memory; when optical three-dimensional data is processed, the control module sends a first instruction to simultaneously connect the external Flash memory with the Flash storage driving module and connect the external DDR3 memory with the DDR3 storage driving module for processing the optical three-dimensional data; when non-optical three-dimensional data is processed, the control module sends a second instruction to connect the external Flash memory with the Flash storage driving module for processing the non-optical three-dimensional data and disconnect the external DDR3 memory with the DDR3 storage driving module;

the dedicated ASIC chip system for optical three-dimensional sensing further includes a switch module, the switch module is connected with the controller module, when the switch module is closed by a switching device or is closed by a third instruction sent by the controller module, the external DDR3 memory is connected with the DDR3 storage driving module, and when the switch module is disconnected by the switching device or is disconnected by a fourth instruction sent by the controller module, the external DDR3 memory is disconnected with the DDR3 storage driving module; and the dedicated ASIC chip system for optical three-dimensional sensing further includes a USB interface module, a data input terminal of the USB interface module is connected with the AXI bus interface module, and a data output terminal of the USB interface module is connected with an external image processor.

The dedicated ASIC chip system for optical three-dimensional sensing further includes an I2S interface module, a signal input terminal of the I2S interface module is connected with an external audio sensor, and a signal output terminal of the I2S interface module is connected with the AXI bus interface module and the APB bus interface module respectively.

The USB interface module includes a USB3.0 controller module and a USB interface, and the USB3.0 controller module is connected with the USB interface.

The dedicated ASIC chip system for optical three-dimensional sensing further includes a power management module, and the power management module is connected with the APB bus interface module.

The RGB CMOS driving module includes an RGB CMOS interface, the IR CMOS driving module includes an IR CMOS interface, the Flash storage driving module includes a Flash interface, and the DDR3 storage driving module includes a DDR3 interface.

To achieve the object above, the present disclosure uses yet another technical solution:

a dedicated ASIC chip system for optical three-dimensional sensing includes a DEPTH ENGINE module, a REGISTER PROCESSOR module, a controller module, a register module, an RGB CMOS driving module, an IR CMOS driving module, an AXI bus interface module, an APB bus interface module, an AXI/APB bridge module and an external storage driving module;

a signal input terminal of the DEPTH ENGINE module is connected with the IR CMOS driving module, a control signal terminal of the DEPTH ENGINE module is connected with the controller module, a data terminal of the DEPTH ENGINE module is connected with the AXI bus interface module, a signal input terminal of the REGISTER PROCESSOR module is connected with the RGB CMOS driving module, a control signal terminal of the REGISTER PROCESSOR module is connected with the controller module, the controller module is further connected with the register module and the AXI bus interface module respectively, the register module is further connected with the AXI bus interface module, the AXI bus interface module is connected with the APB bus interface module through the AXI/APB bridge module, the RGB CMOS driving module is further connected with the AXI bus interface module and the APB bus interface module respectively, the IR CMOS driving module is further connected with the AXI bus interface module and the APB bus interface module respectively, and the external storage driving module is connected with the AXI bus interface module and the APB bus interface module respectively; and the external storage driving module includes a Flash storage driving module connected with an external Flash memory and a DDR3 storage driving module connected with an external DDR3 memory; when optical three-dimensional data is processed, the control module sends a first instruction to simultaneously connect the external Flash memory with the Flash storage driving module and connect the external DDR3 memory with the DDR3 storage driving module for processing the optical three-dimensional data; when non-optical three-dimensional data is processed, the control module sends a second instruction to connect the external Flash memory with the Flash storage driving module for processing the non-optical three-dimensional data and disconnect the external DDR3 memory with the DDR3 storage driving module.

The dedicated ASIC chip system for optical three-dimensional sensing further includes a switch module, the switch module is connected with the controller module, when the switch module is closed by a switching device or is closed by a third instruction sent by the controller module, the external DDR3 memory is connected with the DDR3 storage driving module, and when the switch module is disconnected by the switching device or is disconnected by a fourth instruction sent by the controller module, the external DDR3 memory is disconnected with the DDR3 storage driving module.

The dedicated ASIC chip system for optical three-dimensional sensing further includes an I2S interface module, a signal input terminal of the I2S interface module is connected with an external audio sensor, and a signal output terminal of the I2S interface module is connected with the AXI bus interface module and the APB bus interface module respectively.

The dedicated ASIC chip system for optical three-dimensional sensing further includes a USB interface module, a data input terminal of the USB interface module is connected with the AXI bus interface module, and a data output terminal of the USB interface module is connected with an external image processor.

The USB interface module includes a USB3.0 controller module and a USB interface, and the USB3.0 controller module is connected with the USB interface.

The dedicated ASIC chip system for optical three-dimensional sensing further includes a power management module, and the power management module is connected with the APB bus interface module.

The RGB CMOS driving module includes an RGB CMOS interface, the IR CMOS driving module includes an IR CMOS interface, the Flash storage driving module includes a Flash interface, and the DDR3 storage driving module includes a DDR3 interface.

The present disclosure has the following beneficial effects: the dedicated ASIC chip system for optical three-dimensional sensing includes the DEPTH ENGINE module, the REGISTER PROCESSOR module, the controller module, the register module, the RGB CMOS driving module, the IR CMOS driving module, the AXI bus interface module, the APB bus interface module, the AXI/APB bridge module and the external storage driving module; the external storage driving module includes the Flash storage driving module connected with the external Flash memory and the DDR3 storage driving module connected with the external DDR3 memory; when the optical three-dimensional data is processed, the control module sends the first instruction to simultaneously connect the external Flash memory with the Flash storage driving module and connect the external DDR3 memory with the DDR3 storage driving module for processing the optical three-dimensional data; and when the non-optical three-dimensional data is processed, the control module sends the second instruction to connect the external Flash memory with the Flash storage driving module for processing the non-optical three-dimensional data and disconnect the external DDR3 memory with the DDR3 storage driving module. Therefore, when the optical three-dimensional data is processed, the dedicated ASIC chip system for optical three-dimensional sensing is simultaneously connected with the external Flash memory and the external DDR3 memory to quickly process high-precision optical three-dimensional data, the resolution of an optical three-dimensional depth image obtained from the processing is high, and the delay is short.

BRIEF DESCRIPTION OF THE DRAWINGS

To illustrate technical solutions in the embodiments of the present disclosure more clearly, a brief introduction on the accompanying drawings which are needed in the description of the embodiments of the present disclosure will be given below. Apparently, the accompanying drawings in the description below are merely some of the embodiments of the present disclosure, based on which other drawings can be obtained by those of ordinary skill in the art without any creative effort.

DETAILED DESCRIPTION OF SOME EMBODIMENTS

In order that the technical problems of the present disclosure are solved and that the adopted technical solutions and the achieved technical effects are clearer, a further detailed description of the technical solutions in the embodiments of the present disclosure will be given below in combination with accompanying drawings. Apparently, the embodiments described below are merely a part, but not all, of the embodiments. All of other embodiments, obtained by those of ordinary skill in the art based on the embodiments in the present disclosure without any creative effort, fall in the protection scope of the present disclosure.

Figure 1:
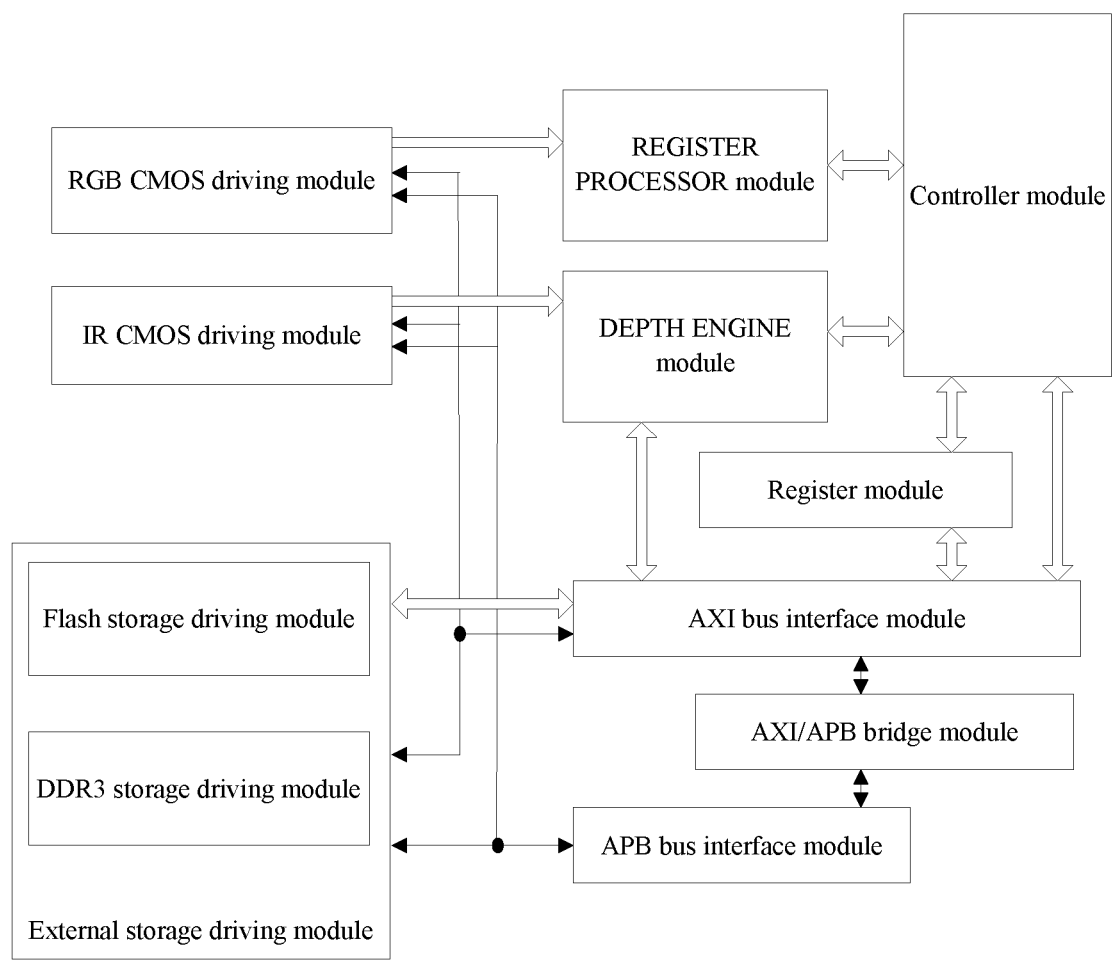
FIG. 1 is a structural block diagram of a first embodiment of a dedicated ASIC chip system for optical three-dimensional sensing provided by the present disclosure.

Referring to FIG. 1, it is a structural block diagram of a first embodiment of a dedicated ASIC chip system for optical three-dimensional sensing provided by the present disclosure. The dedicated ASIC chip system for optical three-dimensional sensing can be applied to all kinds of optical three-dimensional sensors.

The dedicated ASIC chip system for optical three-dimensional sensing includes a DEPTH ENGINE module, a REGISTER PROCESSOR module, a controller module, a register module, an RGB CMOS driving module, an IR CMOS driving module, an AXI bus interface module, an APB bus interface module, an AXI/APB bridge module and an external storage driving module;

a signal input terminal of the DEPTH ENGINE module is connected with the IR CMOS driving module, a control signal terminal of the DEPTH ENGINE module is connected with the controller module, a data terminal of the DEPTH ENGINE module is connected with the AXI bus interface module, a signal input terminal of the REGISTER PROCESSOR module is connected with the RGB CMOS driving module, the control signal terminal of the REGISTER PROCESSOR module is connected with the controller module, the controller module is further connected with the register module and the AXI bus interface module respectively, the register module is further connected with the AXI bus interface module, the AXI bus interface module is connected with the APB bus interface module through the AXI/APB bridge module, the RGB CMOS driving module is further connected with the AXI bus interface module and the APB bus interface module respectively, the IR CMOS driving module is further connected with the AXI bus interface module and the APB bus interface module respectively, and the external storage driving module is connected with the AXI bus interface module and the APB bus interface module respectively; and the external storage driving module includes a Flash storage driving module connected with an external Flash memory and a DDR3 storage driving module connected with an external DDR3 memory; when optical three-dimensional data is processed, the control module sends a first instruction to simultaneously connect the external Flash memory with the Flash storage driving module and connect the external DDR3 memory with the DDR3 storage driving module for processing the optical three-dimensional data; when non-optical three-dimensional data is processed, the control module sends a second instruction to connect the external Flash memory with the Flash storage driving module for processing the non-optical three-dimensional data and disconnect the external DDR3 memory with the DDR3 storage driving module.

The DEPTH ENGINE module is a depth engine circuit, the REGISTER PROCESSOR module is a processing buffer circuit, the RGB CMOS driving module is a red, green and blue photosensitive sensor driving circuit, the IR CMOS driving module is an infrared photosensitive sensor driving circuit, the AXI bus interface module is an AXI interface circuit conforming to an AXI bus protocol, the APB bus interface module is an APB interface circuit conforming to an APB bus protocol, and the AXI/APB bridge module is an AXI/APB bridge module for reciprocal conversion of the AXI bus protocol and the APB bus protocol. For various above circuits, those skilled in the art can select different circuit connection modes and components and parts with different parameters in the background of this technical solution according to common knowledge, so as to achieve corresponding functions of the circuits, and examples will be given here for repeated introduction.

The signal input terminal of the RGB CMOS driving module is connected with an external color camera. The signal input terminal of the IR CMOS driving module is connected with an external infrared camera.

When optical three-dimensional data is processed, the dedicated ASIC chip system for optical three-dimensional sensing provided by the present disclosure is simultaneously connected with an external Flash memory and an external DDR3 memory to quickly process high-precision optical three-dimensional data, the resolution of an optical three-dimensional depth image obtained from the processing is high, and the delay is short.

Figure 2:
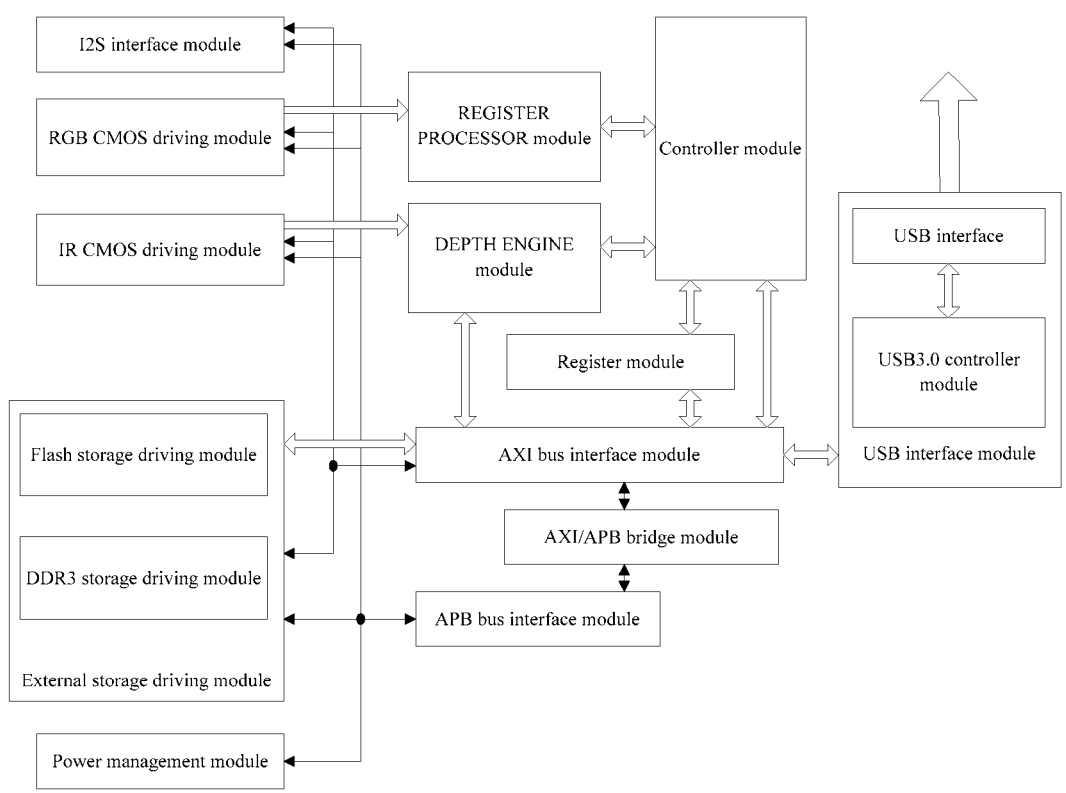
FIG. 2 is a structural block diagram of a second embodiment of a dedicated ASIC chip system for optical three-dimensional sensing provided by the present disclosure.

Referring to FIG. 2, it is a structural block diagram of a second embodiment of a dedicated ASIC chip system for optical three-dimensional sensing provided by the present disclosure. Compared with the first embodiment of the dedicated ASIC chip system for optical three-dimensional sensing, a switch module, an I2S interface module, a USB interface module and a power management module are added in the second embodiment of the dedicated ASIC chip system for optical three-dimensional sensing.

The dedicated ASIC chip system for optical three-dimensional sensing further includes a switch module, the switch module is connected with the controller module, when the switch module is closed by a switching device or is closed by a third instruction sent by the controller module, the external DDR3 memory is connected with the DDR3 storage driving module, and when the switch module is disconnected by the switching device or is disconnected by a fourth instruction sent by the controller module, the external DDR3 memory is disconnected with the DDR3 storage driving module.

The switch module can be cooperatively used with soft switching, e.g., a program instruction, or hard switching, e.g., a single-pole double-throw switch device to close or disconnect the switch module, and the specific form is determined according to an actual application occasion.

The dedicated ASIC chip system for optical three-dimensional sensing further includes an I2S interface module, a signal input terminal of the I2S interface module is connected with an external audio sensor, and a signal output terminal of the I2S interface module is connected with the AXI bus interface module and the APB bus interface module respectively.

The I2S interface module is a built-in audio bus circuit of an integrated circuit and is a bus standard formulated for audio data transmission between digital audio devices, the bus adopts a design of transmitting clock and data signals along independent conducting wires, data and clock signals are separated to avoid distortion induced by time difference, and the bus is specially responsible for the data transmission between the audio devices. The I2S interface module has 3 main signals, which are respectively as follows:

1. Serial clock SCLK, also called bit clock (BCLK), that is, the SCLK has one pulse corresponding to each bit of data of digital audio. The frequency of SCLK=2×sampling frequency×sampling bits.

2. Frame clock LRCK (also called WS), used for switching the data of left and right sound channels. If LRCK is "1", it indicates that the data of the right sound channel is transmitted, and if LRCK is "0", it indicates that the data of the left sound channel is transmitted. The frequency of LRCK is equal to the sampling frequency.

3. Serial data SDATA, namely audio data expressed by binary complement.

The dedicated ASIC chip system for optical three-dimensional sensing further includes a USB interface module, a data input terminal of the USB interface module is connected with the AXI bus interface module, and a data output terminal of the USB interface module is connected with an external image processor.

The USB interface module includes a USB3.0 controller module and a USB interface, and the USB3.0 controller module is connected with the USB interface.

The USB interface module is a universal serial bus circuit and is a serial interface circuit, which is fast, bidirectional, cheap and is able to carry out synchronous transmission and support hot plug. The USB interface module is convenient to use and can be connected with a plurality of different devices. The USB3.0 controller module requires new physical layers of two channels for shunting transmitted data to achieve an expected high rate, and the adopted Packet-routing technology will allow the data transmission only when a terminal device needs to transmit data. The specification supports multiple data flows of a single device and can retain respective priority for each data flow.

The dedicated ASIC chip system for optical three-dimensional sensing further includes a power management module, and the power management module is connected with the APB bus interface module.

The power management module is mainly responsible for identifying the power supply amplitude of a to-be-powered circuit, so as to generate corresponding short moment waves to promote a rear stage circuit to output power. Models of commonly used power management chips include HIP6301, IS6537, RT9237, ADP3168, KA7500, TL494 and others.

The RGB CMOS driving module includes an RGB CMOS interface, the IR CMOS driving module includes an IR CMOS interface, the Flash storage driving module includes a Flash interface, and the DDR3 storage driving module includes a DDR3 interface.

The RGB CMOS interface, the IR CMOS interface, the Flash interface and the DDR3 interface are integrated on a hardware structure of the dedicated ASIC chip system for optical three-dimensional sensing, so that the volume is small.

The dedicated ASIC chip system for optical three-dimensional sensing provided by the present disclosure improves the image processing resolution and the number of image frames processed per minute, improves the resolution of the depth image obtained by the dedicated ASIC chip system for optical three-dimensional sensing by processing, shortens the delay time and realizes precise real-time optical three-dimensional sensing.

The above contents are merely preferred embodiments of the present disclosure, those of ordinary skill in the art can make modifications on the specific implementations and the application range according to the idea of the present disclosure, and the contents of the description should not be construed as limitations to the present disclosure.

What is claimed is:

1. A dedicated ASIC chip system for optical three-dimensional sensing, comprising a DEPTH ENGINE module, a REGISTER PROCESSOR module, a controller module, a register module, an RGB CMOS driving module, an IR CMOS driving module, an AXI bus interface module, an APB bus interface module, an AXI/APB bridge module and an external storage driving module, wherein:
   a signal input terminal of the DEPTH ENGINE module is connected with the IR CMOS driving module, a control signal terminal of the DEPTH ENGINE module is connected with the controller module, a data terminal of the DEPTH ENGINE module is connected with the AXI bus interface module, a signal input terminal of the REGISTER PROCESSOR module is connected with the RGB CMOS driving module, a control signal terminal of the REGISTER PROCESSOR module is connected with the controller module, the controller module is further connected with the register module and the AXI bus interface module respectively, the register module is further connected with the AXI bus interface module, the AXI bus interface module is connected with the APB bus interface module through the AXI/APB bridge module, the RGB CMOS driving module is further connected with the AXI bus interface module and the APB bus interface module respectively, the IR CMOS driving module is further connected with the AXI bus interface module and the APB bus interface module respectively, and the external storage driving module is connected with the AXI bus interface module and the APB bus interface module respectively;
   the external storage driving module comprises a Flash storage driving module connected with an external Flash memory and a DDR3 storage driving module connected with an external DDR3 memory; when optical three-dimensional data is processed, the control module sends a first instruction to simultaneously connect the external Flash memory with the Flash storage driving module and connect the external DDR3 memory with the DDR3 storage driving module for processing the optical three-dimensional data; when non-optical three-dimensional data is processed, the control module sends a second instruction to connect the external Flash memory with the Flash storage driving module for processing the non-optical three-dimensional data and disconnect the external DDR3 memory with the DDR3 storage driving module;
   the dedicated ASIC chip system for optical three-dimensional sensing further comprises a switch module, the switch module is connected with the controller module, when the switch module is closed by a switching device or is closed by a third instruction sent by the controller module, the external DDR3 memory is connected with the DDR3 storage driving module, and when the switch module is disconnected by the switching device or is disconnected by a fourth instruction sent by the controller module, the external DDR3 memory is disconnected with the DDR3 storage driving module; and
   the dedicated ASIC chip system for optical three-dimensional sensing further comprises an I2S interface module, a signal input terminal of the I2S interface module is connected with an external audio sensor, and a signal output terminal of the I2S interface module is connected with the AXI bus interface module and the APB bus interface module respectively.

2. The dedicated ASIC chip system for optical three-dimensional sensing of claim 1, further comprising a USB interface module, wherein a data input terminal of the USB interface module is connected with the AXI bus interface module, and a data output terminal of the USB interface module is connected with an external image processor.

3. The dedicated ASIC chip system for optical three-dimensional sensing of claim 2, wherein the USB interface module comprises a USB3.0 controller module and a USB interface, and the USB3.0 controller module is connected with the USB interface.

4. The dedicated ASIC chip system for optical three-dimensional sensing of claim 1, further comprising a power management module, wherein the power management module is connected with the APB bus interface module.

5. The dedicated ASIC chip system for optical three-dimensional sensing of claim 1, wherein the RGB CMOS driving module comprises an RGB CMOS interface, the IR CMOS driving module comprises an IR CMOS interface, the Flash storage driving module comprises a Flash interface, and the DDR3 storage driving module comprises a DDR3 interface.

6. A dedicated ASIC chip system for optical three-dimensional sensing, comprising a DEPTH ENGINE module, a REGISTER PROCESSOR module, a controller module, a register module, an RGB CMOS driving module, an IR CMOS driving module, an AXI bus interface module, an APB bus interface module, an AXI/APB bridge module and an external storage driving module, wherein:
   a signal input terminal of the DEPTH ENGINE module is connected with the IR CMOS driving module, a control signal terminal of the DEPTH ENGINE module is connected with the controller module, a data terminal of the DEPTH ENGINE module is connected with the AXI bus interface module, a signal input terminal of the REGISTER PROCESSOR module is connected with the RGB CMOS driving module, a control signal terminal of the REGISTER PROCESSOR module is connected with the controller module, the controller module is further connected with the register module and the AXI bus interface module respectively, the register module is further connected with the AXI bus interface module, the AXI bus interface module is connected with the APB bus interface module through the AXI/APB bridge module, the RGB CMOS driving module is further connected with the AXI bus interface module and the APB bus interface module respectively, the IR CMOS driving module is further connected with the AXI bus interface module and the APB bus interface module respectively, and the external storage driving module is connected with the AXI bus interface module and the APB bus interface module respectively;
   the external storage driving module comprises a Flash storage driving module connected with an external Flash memory and a DDR3 storage driving module connected with an external DDR3 memory; when optical three-dimensional data is processed, the control module sends a first instruction to simultaneously connect the external Flash memory with the Flash storage driving module and connect the external DDR3 memory with the DDR3 storage driving module for processing the optical three-dimensional data; when non-optical three-dimensional data is processed, the control module sends a second instruction to connect the external Flash memory with the Flash storage driving module for processing the non-optical three-dimensional data and disconnect the external DDR3 memory with the DDR3 storage driving module;

the dedicated ASIC chip system for optical three-dimensional sensing further comprises a switch module, the switch module is connected with the controller module, when the switch module is closed by a switching device or is closed by a third instruction sent by the controller module, the external DDR3 memory is connected with the DDR3 storage driving module, and when the switch module is disconnected by the switching device or is disconnected by a fourth instruction sent by the controller module, the external DDR3 memory is disconnected with the DDR3 storage driving module; and the dedicated ASIC chip system for optical three-dimensional sensing further comprises a USB interface module, a data input terminal of the USB interface module is connected with the AXI bus interface module, and a data output terminal of the USB interface module is connected with an external image processor.

7. The dedicated ASIC chip system for optical three-dimensional sensing of claim 6, further comprising an I2S interface module, wherein a signal input terminal of the I2S interface module is connected with an external audio sensor, and a signal output terminal of the I2S interface module is connected with the AXI bus interface module and the APB bus interface module respectively.

8. The dedicated ASIC chip system for optical three-dimensional sensing of claim 6, wherein the USB interface module comprises a USB3.0 controller module and a USB interface, and the USB3.0 controller module is connected with the USB interface.

9. The dedicated ASIC chip system for optical three-dimensional sensing of claim 6, further comprising a power management module, wherein the power management module is connected with the APB bus interface module.

10. The dedicated ASIC chip system for optical three-dimensional sensing of claim 6, wherein the RGB CMOS driving module comprises an RGB CMOS interface, the IR CMOS driving module comprises an IR CMOS interface, the Flash storage driving module comprises a Flash interface, and the DDR3 storage driving module comprises a DDR3 interface.

11. A dedicated ASIC chip system for optical three-dimensional sensing, comprising a DEPTH ENGINE module, a REGISTER PROCESSOR module, a controller module, a register module, an RGB CMOS driving module, an IR CMOS driving module, an AXI bus interface module, an APB bus interface module, an AXI/APB bridge module and an external storage driving module, wherein:

a signal input terminal of the DEPTH ENGINE module is connected with the IR CMOS driving module, a control signal terminal of the DEPTH ENGINE module is connected with the controller module, a data terminal of the DEPTH ENGINE module is connected with the AXI bus interface module, a signal input terminal of the REGISTER PROCESSOR module is connected with the RGB CMOS driving module, a control signal terminal of the REGISTER PROCESSOR module is connected with the controller module, the controller module is further connected with the register module and the AXI bus interface module respectively, the register module is further connected with the AXI bus interface module, the AXI bus interface module is connected with the APB bus interface module through the AXI/APB bridge module, the RGB CMOS driving module is further connected with the AXI bus interface module and the APB bus interface module respectively, the IR CMOS driving module is further connected with the AXI bus interface module and the APB bus interface module respectively, and the external storage driving module is connected with the AXI bus interface module and the APB bus interface module respectively; and the external storage driving module comprises a Flash storage driving module connected with an external Flash memory and a DDR3 storage driving module connected with an external DDR3 memory; when optical three-dimensional data is processed, the control module sends a first instruction to simultaneously connect the external Flash memory with the Flash storage driving module and connect the external DDR3 memory with the DDR3 storage driving module for processing the optical three-dimensional data; when non-optical three-dimensional data is processed, the control module sends a second instruction to connect the external Flash memory with the Flash storage driving module for processing the non-optical three-dimensional data and disconnect the external DDR3 memory with the DDR3 storage driving module.

12. The dedicated ASIC chip system for optical three-dimensional sensing of claim 11, further comprising a switch module, wherein the switch module is connected with the controller module, when the switch module is closed by a switching device or is closed by a third instruction sent by the controller module, the external DDR3 memory is connected with the DDR3 storage driving module, and when the switch module is disconnected by the switching device or is disconnected by a fourth instruction sent by the controller module, the external DDR3 memory is disconnected with the DDR3 storage driving module.

13. The dedicated ASIC chip system for optical three-dimensional sensing of claim 11, further comprising an I2S interface module, wherein a signal input terminal of the I2S interface module is connected with an external audio sensor, and a signal output terminal of the I2S interface module is connected with the AXI bus interface module and the APB bus interface module respectively.

14. The dedicated ASIC chip system for optical three-dimensional sensing of claim 11, further comprising a USB interface module, wherein a data input terminal of the USB interface module is connected with the AXI bus interface module, and a data output terminal of the USB interface module is connected with an external image processor.

15. The dedicated ASIC chip system for optical three-dimensional sensing of claim 14, wherein the USB interface module comprises a USB3.0 controller module and a USB interface, and the USB3.0 controller module is connected with the USB interface.

16. The dedicated ASIC chip system for optical three-dimensional sensing of claim 11, further comprising a power management module, wherein the power management module is connected with the APB bus interface module.

17. The dedicated ASIC chip system for optical three-dimensional sensing of claim 11, wherein the RGB CMOS driving module comprises an RGB CMOS interface, the IR CMOS driving module comprises an IR CMOS interface, the Flash storage driving module comprises a Flash interface, and the DDR3 storage driving module comprises a DDR3 interface.

* * * * *